United States Patent
Gao et al.

(10) Patent No.: US 10,115,475 B2
(45) Date of Patent: Oct. 30, 2018

(54) COMPENSATION CIRCUIT FOR COMPENSATING FOR AN INPUT CHARGE IN A SAMPLE AND HOLD CIRCUIT

(71) Applicant: NXP USA, Inc., Austin, TX (US)

(72) Inventors: Yuan Gao, Cugnaux (FR); Jerome Jean Pierre Luc Casters, Munich (DE); Stephane Laurant Michel Ollitrault, Seysses (FR)

(73) Assignee: NXP USA, Inc., Austin, TX (US)

( * ) Notice: Subject to any disclaimer, the term of this patent is extended or adjusted under 35 U.S.C. 154(b) by 171 days.

(21) Appl. No.: 15/363,160

(22) Filed: Nov. 29, 2016

(65) Prior Publication Data

US 2017/0162275 A1 Jun. 8, 2017

(30) Foreign Application Priority Data

Dec. 2, 2015 (WO) .................. PCT/IB2015/002496

(51) Int. Cl.
*H02J 7/00* (2006.01)
*G11C 27/02* (2006.01)

(52) U.S. Cl.
CPC .......... *G11C 27/026* (2013.01); *H02J 7/0021* (2013.01)

(58) Field of Classification Search
CPC .................................................... H02J 7/0021
USPC ........................................................ 320/126
See application file for complete search history.

(56) References Cited

U.S. PATENT DOCUMENTS

| | | | |
|---|---|---|---|
| 5,481,212 A * | 1/1996 | Shima | G11C 27/026 327/91 |
| 5,617,093 A | 4/1997 | Klein | |
| 2002/0089366 A1* | 7/2002 | Gupta | G06G 7/1865 327/337 |
| 2005/0038771 A1* | 2/2005 | Sugihara | G06F 9/465 |
| 2010/0090738 A1* | 4/2010 | Changchein | G06F 1/10 327/170 |
| 2014/0152478 A1* | 6/2014 | Lewis | H03M 1/0673 341/123 |

OTHER PUBLICATIONS

Willis, David J. et al.: "Zero CVF Input Current Switched-Capacitor Instrumentation Amplifier", IEEE, 2005, pp: 1255-1258.

\* cited by examiner

*Primary Examiner* — Suchin Parihar

(57) ABSTRACT

A compensation circuit for compensating for an input charge at a first input of a sample and hold circuit, comprising: a first buffer, a first compensation capacitor comprising a first compensation terminal switchable between a first buffer input and a first buffer output, and a second compensation terminal switchable between the first buffer output and a reference terminal, and a control circuit to switch the first compensation terminal to the first buffer1 output and the second compensation terminal to the reference terminal during sampling, for storing a compensation charge into the first compensation capacitor, and to switch the first compensation terminal to the first buffer input and the second compensation terminal to the first buffer output during holding, for discharging the first compensation capacitor into the first input. The compensation charge is substantially equal to the input charge.

20 Claims, 4 Drawing Sheets

COMPENSATION CIRCUIT FOR COMPENSATING FOR AN INPUT CHARGE IN A SAMPLE AND HOLD CIRCUIT

FIELD OF THE INVENTION

This invention relates to a compensation circuit for compensating for an input charge at a first input of a sample and hold circuit, an input charge-compensated circuit including the compensation circuit, a battery controller and a battery management system.

BACKGROUND OF THE INVENTION

Converters for converting an analogue voltage signal to a corresponding digital value can be implemented using for example a sample and hold circuit. The sample and hold circuit samples and holds the analogue voltage signal at a predetermined sampling frequency. At a particular sampling period, an input charge is transferred from an input signal source, for example a source capacitor, to an input capacitor of the sample and hold circuit. Said input charge is proportional to the analogue voltage signal in said sampling period. In further digital processing of the converter a corresponding digital value can be assigned to each transferred input charge.

In some applications, for example in high accuracy converters for battery management systems monitoring a voltage output of a battery cell, the source capacitor can be part of a source low pass filter implemented at the input of the converter for attenuating spurious high frequency components which may be generating by neighbouring devices or by suddenly connecting or disconnecting several battery cells in parallel. The low pass filter has typically a cut-off frequency much lower than the predetermined sampling frequency of the sample and hold circuit. This causes the source capacitor of the low pass filter to discharge to the much smaller input capacitor of the sample and hold circuit. The discharge of the source capacitor causes a leakage of the input charge due to the transfer of the input charge to the sample and hold circuit, thereby degrading the accuracy of the converter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements, which correspond to elements already described, may have the same reference numerals.

DETAILED DESCRIPTION OF THE PREFERRED EMBODIMENTS

Herein below an example of compensation circuit for use in a sample and hold circuit will be described. The sample and hold circuit may be part of an analogue to digital converter. The analogue to digital converter may be implemented in battery management systems for monitoring a voltage level of one or more battery cells of for example electric vehicles powered by electric powertrains.

The compensation circuit compensates for an input charge at a first input of the sample and hold circuit during sampling of an analogue input voltage via the first input. A control circuit controls the compensation circuit such that the compensation circuit generates a compensation charge equivalent to the input charge. The compensation charge is stored in a first compensation capacitor via a first buffer when the sample and hold circuit is sampling the analogue input voltage. The control circuit controls the compensation circuit such that the first compensation capacitor is discharged of the stored compensation charge when the sample and hold circuit is holding the analogue input voltage. The same charge is thus stored during sampling, and re-injected to the first input when the sample and hold circuit is electrically decoupled from the analogue input voltage. In this way the input charge transferred in the preceding sampling period is restored as equivalent compensation charge to a source of the analogue input voltage, for example a source capacitor of an input filter.

This has the effect that the sampled analogue input voltage does not decrease after an increasing number of sampling periods but fluctuates substantially around a stable voltage value. The inventive compensation circuit improves the accuracy of high resolution converters used to convert voltages into digital values with relative small errors.

Additionally, the compensation circuit is controlled in synchronicity with the sampling and holding phases of the sample and hold circuit thereby simplifying the design of the compensation circuit and related sample and hold circuit, and allowing to use a limited number of components with respect to prior art solutions.

Figure 1:
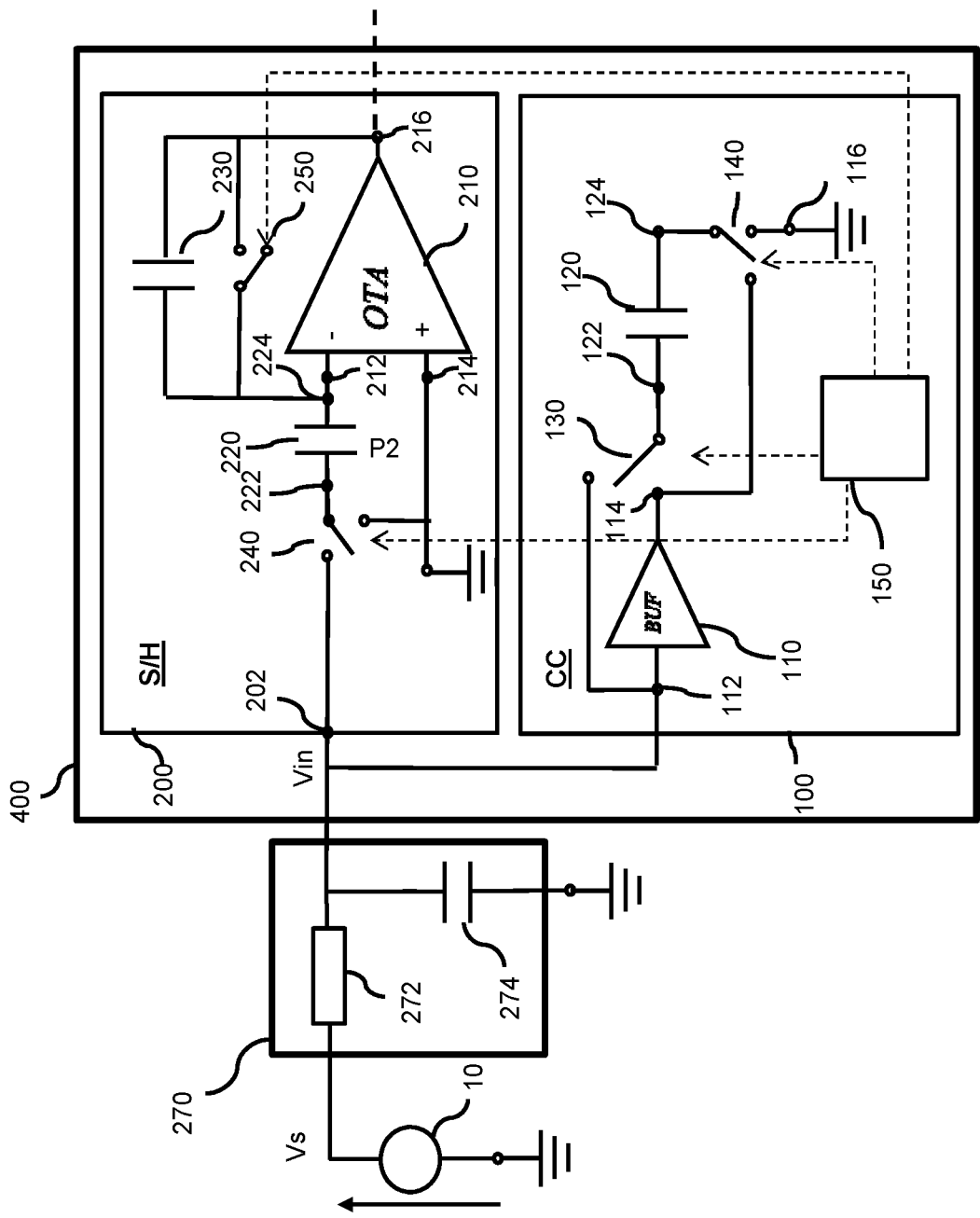
FIG. 1 schematically shows a circuit diagram of a first example of a single-ended input charge compensated circuit, FIG. 2 schematically shows a circuit diagram of an example of a single-ended compensation circuit, FIG. 3 schematically shows a circuit diagram of an example of a single-ended sample and hold circuit, FIG. 4 schematically shows a circuit diagram of an example of a differential input charge-compensated circuit.

FIG. 1 schematically shows a circuit diagram of an example of a single-ended input charge compensated circuit 400. The input charge-compensated circuit 400 includes a sample and hold circuit 200 and a compensation circuit 100.

The sample and hold circuit 200 includes a first input 202 for sampling an analogue input voltage signal Vin at the first input 202. An analogue to digital converter can include the sample and hold circuit 200 for converting the analogue input voltage signal to a digital value signal by sampling and holding the analogue input voltage signal Vin.

The sample and hold circuit 200 may include an amplifier 210, a first input capacitor 220, a feedback capacitor 230, a first sample and hold switch 240 and a second sample and hold switch 250.

The amplifier 210 has a first amplifier input 212, a second amplifier input 214 and an amplifier output 216.

The amplifier 210 may be any type of amplifier suitable for the specific implementation. The amplifier 210 may be a differential operational amplifier of which the first amplifier input 212 is an inverting input and the second amplifier input 214 is a non-inverting input. The amplifier 210 may be an operational transconductance amplifier, a current amplifier, a voltage amplifier, or a transimpedance amplifier.

The first input capacitor 220 has a first input capacitor terminal 222 and a second input capacitor terminal 224 electrically connected to the first amplifier input 212.

The first feedback capacitor 230 may capacitively couple the first amplifier input 212 to the amplifier output 216.

The first sample and hold switch 240 is configured for electrically coupling, when the first sample and hold switch 240 is switched in one state, the first input 202 of the sample and hold circuit 200 to the first input capacitor terminal 222, and when the first sample and hold circuit switch 240 is switched in another state, the first input capacitor terminal 222 to the second amplifier input 214.

The second amplifier input 214 may be electrically coupled to the ground.

The input charge-compensated circuit 400 is configured for coupling to an input filter 270 for filtering frequency components of an input voltage source signal Vs above a predetermined cut-off frequency. The input filter 270 may be arranged in series with a voltage source 10 for supplying the input voltage source signal Vs. The input filter 270 is arranged to filter the input voltage source signal Vs to obtain the analogue input voltage signal Vin. The input filter may be used to attenuate high frequency noise due to for example voltage spikes induced by neighboring switching devices or by sudden connection or disconnection of the voltage source 10 from the input charge compensated circuit 400. The input filter 270 may be implemented as an RC filter having a filter series resistor 272 and a filter shunt capacitor 274. Alternatively, the input filter 270 may be implemented as an RC pi-filter, for example having an additional filter shunt capacitor on a side of the voltage source 10. The shunt capacitor 274 may be several hundreds of order of magnitude bigger than capacitors 220 and 230 of the sample and hold circuit 200. The input filter 270 may have the predetermined cut-off frequency much lower than the sampling frequency of the switches 240 and 250 of the sample and hold circuit 200.

For example, the filter series resistor 272 may have a resistance in the order of a few kilo ohms (KOhm) and the filter shunt capacitor 274 may have a capacitance of several tens of nano Farads (nF). In a specific example, the filter series resistor 272 may be 2 KOhms and the filter shunt capacitor 274 may be 50 nF, then the cut-off frequency of the input filter 270 may be approximatively 1.6 kHz. The sampling frequency and the corresponding size of the capacitors 220 and 230 are chosen depending on a desired precision of the sample and hold circuit 200. The sampling frequency of the sample and hold circuit 200 may for example be in the order of a few Mega Hertz (MHz), thus much larger than the predetermined cut-off frequency of the input filter 270. As a consequence, the filtered analogue input voltage Vin may slowly vary compared to the sampling frequency of the sample and hold circuit 200. For the same sampling frequency, the higher is the resolution of the sample and hold circuit, the larger is the number of sampling and holding cycles, and the longer time it will take to execute the larger number of sampling and holding cycles (for example in sigma-delta or incremental modulators). For high accuracy converters, the filter shunt capacitor 274 or any other source capacitor or component, may discharge during this time hampering the accuracy of the sample and hold circuit 200 and thereby of the converter using it. The compensation circuit 100 prevents that the discharge of the filter shunt capacitor 274 affects the accuracy of the sample and hold circuit 200.

The compensation circuit 100 compensates for an input charge leakage at the first input 202 of the sample and hold circuit 200. For example, during sampling the analogue input voltage signal, charges may leak from an input source, for example from the filter shunt capacitor 274, to the sample and hold circuit 200 via the first input 202. The compensation circuit 100 stores a compensation charge equivalent to the input charge leakage when the sample and hold circuit 200 is sampling the analogue input voltage. The compensation circuit 100 includes a first buffer 110, a first compensation capacitor 210 and a control circuit 150. The first buffer 110 has a first buffer input 112 electrically coupled to the first input 202 of the sample and hold circuit 200 and a first buffer output 114.

The first compensation capacitor 120 has a first compensation terminal 122 and a second compensation terminal 124. The first compensation terminal 122 is switchable between the first buffer input 112 and the first buffer output 114 for electrically coupling the first compensation terminal 122 to the first buffer input 114 and the first buffer output 114, respectively.

The second compensation terminal 124 is switchable between the first buffer output 114 and a reference terminal 116 for electrically coupling the second compensation terminal 124 to the first buffer output 114 and a first reference terminal 116, respectively. The reference terminal 116 may be electrically coupled to ground.

The control circuit 150 controls the switchable first compensation terminal 122, the second compensation terminal 124 and the switches 240 and 250 of the sample and hold circuit 200.

The control circuit 150 is configured to switch the first sample and hold switch 240 for electrically coupling the first input 202 to the first input capacitor terminal 222 for sampling the analogue input voltage signal Vin.

In a single-ended sample and hold circuit, the second amplifier input 214 may be connected to a reference potential, for example to the ground. In differential amplifiers, the inverting input, i.e. the first amplifier input 212 in this embodiment, is a high impedance node virtually grounded when the non-inverting input is grounded and the differential amplifier operates in a feedback configuration and high direct (i.e. with the feedback interrupted) gain. As a consequence, when sampling the analogue input voltage Vin, the first input capacitor terminal 222 is electrically connected to the analogue input voltage signal Vin and the second capacitor terminal 224 is effectively electrically coupled to the ground so that the first input capacitor 220 can be charged by a current flowing therein from the input source via the first input capacitor 220 to the ground.

The control circuit 150 is configured to switch the first sample and hold switch 240 for electrically coupling the first input capacitor terminal 222 to the second amplifier input 214 (grounded in this example) for holding the analogue input voltage signal Vin such that the input charges stored in the first input capacitor 220 in the sampling phase are transferred to the first feedback capacitor 230 during the holding phase.

Gain of the converter 200 show in FIG. 1 is determined by a ratio of the values of the first input capacitor 220 and the first feedback capacitor 230. The gain of the sample and hold circuit 200 may be varied by for example changing the value of the first input capacitor 220. For example, the control circuit 150 may include a configuration register which controls the value of the first input capacitor 240.

A second sample and hold switch 250 may be used to reset the feedback capacitor 230 to a zero voltage value.

The control circuit 150 is configured to switch the first compensation terminal 122 to the first buffer output 114 and the second compensation terminal 124 to the first reference terminal 116 when the sample and hold circuit 200 is sampling the analogue input voltage signal Vin, such that a compensation charge is stored via the buffer 110 into the first compensation capacitor 120 without taking charges from Vin.

The control circuit 150 is configured to switch the first compensation terminal 122 to the first buffer input 112 and the second compensation terminal 124 to the first buffer output 114 when the sample and hold circuit 200 is holding the analogue input voltage signal Vin such that the first compensation capacitor 120 is discharged into the first input 202 of the stored compensation charge.

The compensation charge is substantially equal to the input charge leakage. For example, the first input capacitor 220 may have a first input capacitance value and the first compensation capacitor 120 may have a first compensation capacitance value substantially equal to the first input capacitance value such that the compensation charge is equal to the input charge leakage. The compensation circuit 100 thereby compensates during the holding phase for the whole input charge leakage occurring during the preceding sampling phase.

The analogue input voltage inputted to the first input capacitor 220 during the sampling phase, is buffered via the buffer 110 to the first compensation capacitor 120 having a capacitance equivalent to the first input capacitor 220. The input charge transferred to the first input capacitor 220 during the sampling phase is equivalent to the compensation charge stored into the first compensation capacitor 120 during the same sampling phase.

The compensation circuit may be implemented in any manner suitable for the specific implementation.

In FIG. 1 the compensation circuit 100 includes a first compensation switch 130 and a second compensation switch 140.

The first compensation switch 130 is arranged for electrically coupling, when the first compensation switch 130 is switched in a first state, the first compensation terminal 122 to the first buffer output 114. The first compensation switch 130 is arranged for electrically coupling, when the first compensation switch 130 is switched in a second state, the first compensation terminal 122 to the first buffer input 112.

The second compensation switch 140 is arranged for electrically coupling, when the second compensation switch 140 is switched in a third state, the second compensation terminal 124 to the reference terminal 116. The second compensation switch 140 is arranged for electrically coupling, when the second compensation switch 140 is switched in a fourth state, the second compensation terminal 124 to the first buffer output 114. The control circuit 150 is configured to control the first compensation switch 130 in the first state and the second compensation switch 140 in the third state, when the control circuit is configured to control the sample and hold circuit 200 for sampling the analogue input voltage signal Vin. The control circuit 150 is configured to control the first compensation switch 130 in the second state and the second compensation switch 140 in the fourth state when the control circuit is configured to control the sample and hold circuit 200 for holding the analogue input voltage signal Vin.

The compensation charge is temporarily stored into the compensation capacitor 120 while the sample and hold circuit 200 is sampling the analogue input voltage Vin. When the sample and hold circuit 200 is holding the analogue input voltage signal Vin, the control circuit 150 controls the compensation circuit 100 such the compensation capacitor 120 is arranged in parallel to the first buffer 110 with the first compensation terminal 122 directly connected to the first input 202 of the sample and hold circuit 200 such that the compensation charge equivalent to the input charge leakage can be injected back to the first input 202. In this way the compensation charge is restored back to the first input 202 for the following sampling cycle.

Figure 2:
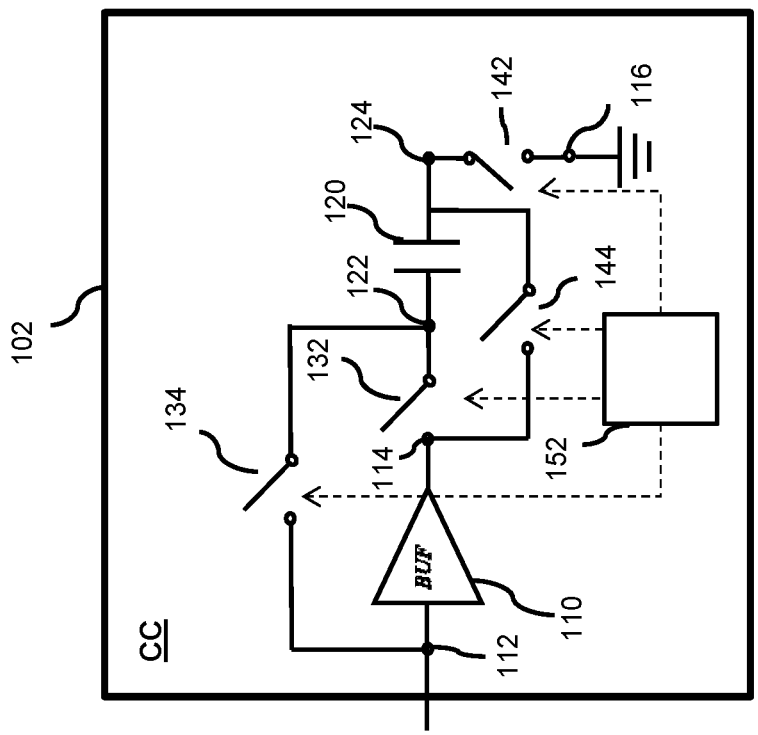

FIG. 2 shows a second example of a compensation circuit 102 according to another embodiment of the invention. The compensation circuit 102 may be a practical implementation of the compensation circuit 100.

The first compensation switch 130 may be implemented with a third compensation switch 132 and a fourth compensation switch 134. The third compensation switch 132 may be configured, when switched on, to electrically couple the first compensation terminal 122 to the first buffer output 114. The fourth compensation switch 134 may be configured, when switched on, to electrically couple the first compensation terminal 122 to the first buffer input 112.

The second compensation switch 140 may be implemented with a fifth compensation switch 142 and a sixth compensation switch 142. The fifth compensation switch 142 may be configured, when switched on, to electrically couple the second compensation terminal 124 to the reference terminal 116. The sixth compensation switch 144 may be configured, when switched on, to electrically couple the second compensation terminal 124 to the first buffer output 114.

The control circuit 152 (not shown in FIG. 2) is configured to switch on the third compensation switch 132 and the fifth compensation switch 142 and to switch off the fourth compensation switch 134 and the sixth compensation switch 144 when the control circuit is configured to control the sample and hold circuit for sampling the analogue input voltage Vin.

The control circuit 152 is configured to switch off the third compensation switch 132 and the fifth compensation switch 142 and to switch on the fourth compensation switch 134 and the sixth compensation switch 144 when the sample and hold circuit is holding the analogue input voltage Vin.

The sample and hold circuit may be implemented in any manner suitable for the specific implementation.

Figure 3:
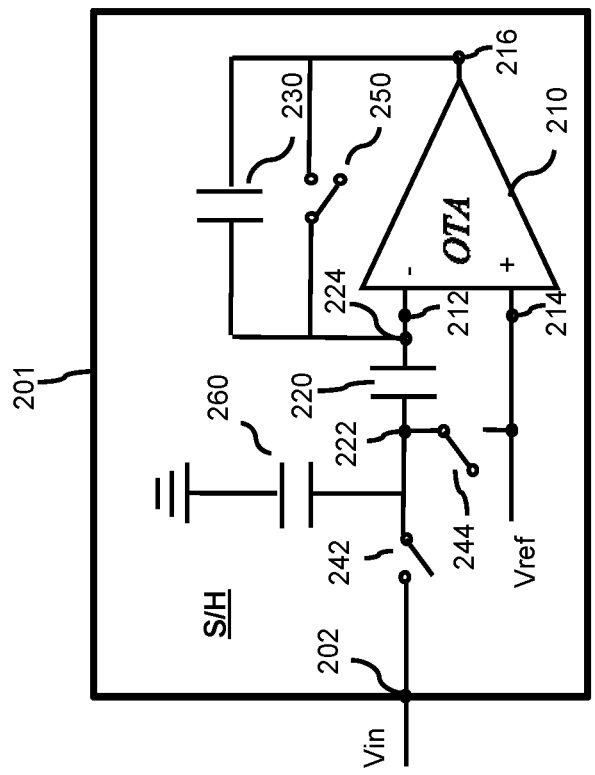

FIG. 3 shows a second example of a sample and hold circuit 201 according to another embodiment of the invention. The sample and hold circuit 201 differs from the sample and hold circuit 200 in that the sample and hold circuit 201 further includes a first shunt capacitor 260 and the first sample and hold switch 240 of FIG. 1 is implemented with two switches, a first series switch 242 and a first shunt switch 244.

The first series switch 242 electrically couples, when switched on, the first sample and hold input 202 to the first capacitor terminal 222. The first shunt switch 244 electrically couples, when switched on, the first capacitor terminal 222 to the second amplifier input 214. The control circuit (not shown in FIG. 3) is configured to switch on the first series switch 242 and switch off the first series switch 244 for sampling the analogue input voltage Vin. The control circuit is configured to switch off the first series switch 242 and switch on the first shunt switch 244 for holding the analogue input voltage Vin such that the input charge stored in the first input capacitor 220 can be transferred to the feedback capacitor 230.

The first shunt capacitor 260 has a first shunt terminal electrically coupled to the first input capacitor terminal 222 and a second shunt terminal electrically coupled to the reference potential. The first shunt capacitor 260 may be used to adapt the dynamic impedance of the first series switch 242 and first shunt switch 244, to minimize the error due to non-equal charges leakage at both sides of the switches during their switching, especially at lower frequency switching when this effect may be more pronounced.

The first shunt capacitor 260 has a first shunt capacitance value which may be tuned to obtain the desired impedance at the first input capacitor terminal 222.

When the compensation circuit 102 of FIG. 2 is used to compensate the charge leakage into the sample and hold circuit 201 of FIG. 3, the first compensation capacitor 120 may be chosen to have a capacitance value equivalent to the sum of the first input capacitance value and the first shunt capacitance value. This ensures that a compensation charge equivalent to the input charge leakage transferred into the first input capacitor 220 and first shunt capacitor 260 is stored in the first compensation capacitor 120.

Figure 4:
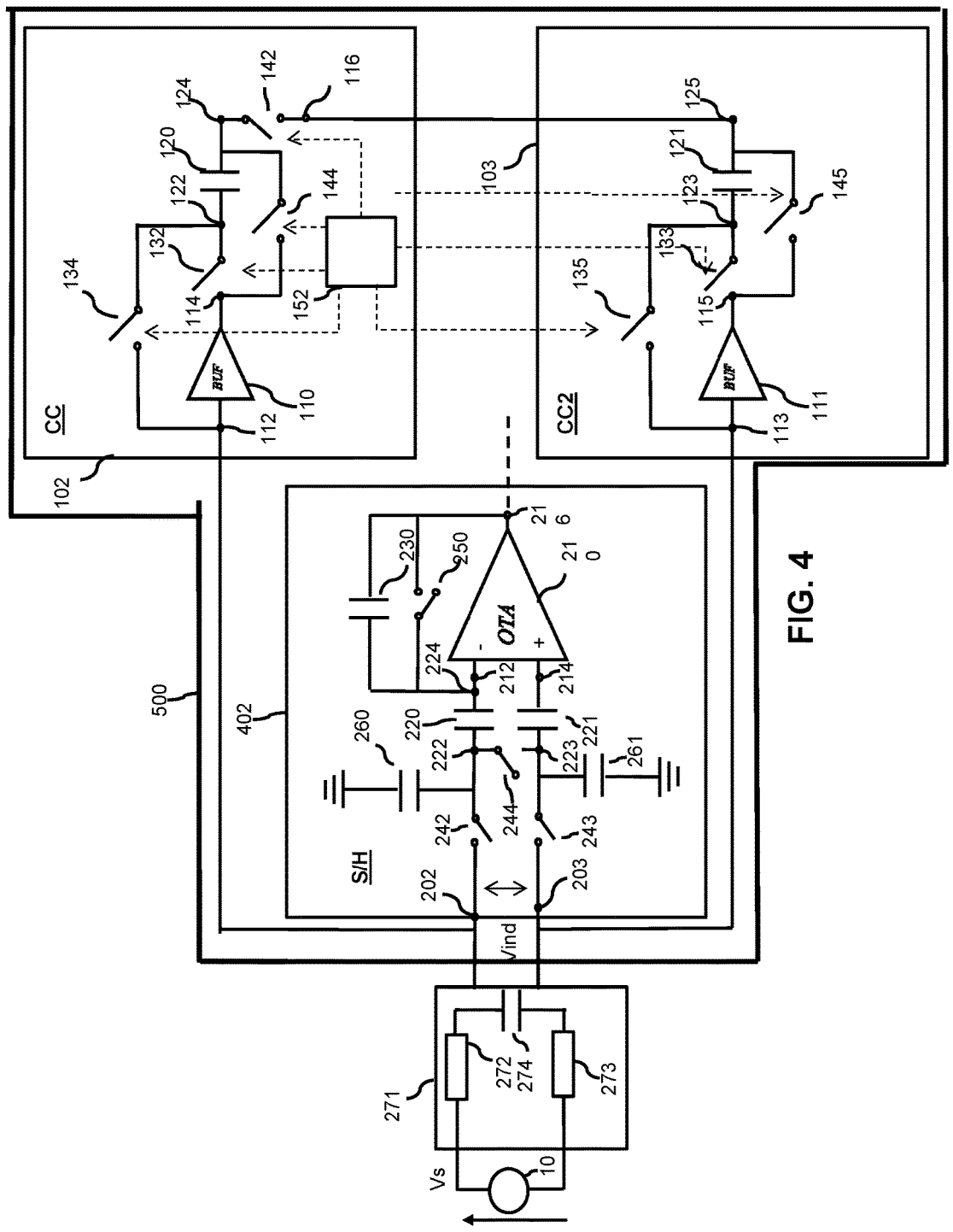

FIG. 4 schematically shows a circuit diagram of an example of a differential input charge-compensated circuit 500. The differential input charge-compensated circuit 500 includes a sample and hold circuit 402 which is a differential sample and hold circuit 402 for sampling and holding a differential analogue input voltage signal Vind at the first input 202 and second input 203. An analogue to digital converter can include the differential input charge-compensated circuit 500 for converting the differential analogue input voltage signal Vind to corresponding digital values.

The differential sample and hold circuit 402 differs from the single-ended sample and hold circuit 201 in that the second amplifier input 214 is not electrically coupled to the ground but to a terminal of a second input capacitor 221. Another terminal 223 of the second input capacitor 221 is electrically coupled to the second input 203 of the sample and hold circuit 402 via the switch 243. When sampling the differential analogue input voltage Vind, the switches 242 and 243 may be switched on, and the switch 244 may be switched off. When the differential analogue input voltage Vind is held by the sample and hold circuit 402, the switches 242 and 243 may be switched off while the switch 244 may be switched on.

The differential input charge-compensated circuit 500 further includes the compensation circuit 102 described with reference to FIG. 2 and a further compensation circuit 103 for compensating for a further input charge leakage occurring through the second input 203 of the sample and hold circuit 402.

The further compensation circuit 103 includes a second buffer 111 having a second buffer input 113 for electrically coupling to the second input 203 of the sample and hold circuit 402 and a second buffer output 115.

The further compensation circuit 103 further includes a second compensation capacitor 121 and switches 133, 135, and 145 which arrangement and functionality are equivalent to the arrangement and functionality of the corresponding switches 132, 134 and 144 of the compensation circuit 102 described with reference to FIG. 2.

The second compensation capacitor 121 has a third compensation terminal 123 which is switchable between the second buffer input 113 via the switch 135 and the second buffer output 115 via the switch 133.

The second compensation capacitor 121 has a fourth compensation terminal 125 for electrically coupling to the reference terminal 116 of the compensation circuit 102. The fourth compensation terminal 125 is switchable to the second buffer output 115 via the switch 145 for electrically coupling the fourth compensation terminal 125 to the second buffer output 115.

The control circuit 152 is configured to switch the switch 133, 135 and 145 of the further compensation circuit 103 in synchronicity with the switches 132, 134 and 144 of the compensation circuit 102. The control circuit 152 is configured to switch the switch 133, 135 and 145 of the further compensation circuit 103 and the switches 132, 134 and 144 of the compensation circuit 102 in synchronicity with the switches 242 and 243 of the sample and hold circuit 402.

Compensation of the input charge leakage is thus performed by using the same sampling and holding phases of the sample and hold circuit 402, thereby simplifying the design and the control of the sample and hold circuit 402 and compensation circuits 102 and 103. No additional phases are required and as a consequence less switches are needed compared to solutions in which additional phases would be required to perform the compensation.

The switch 142 is switched on by the control circuit 152 during the sampling phase such that the second compensation terminal 124 and the fourth compensation terminal 125 are electrically connected together. If the first compensation capacitor 120 and the second compensation capacitor 121 have the same capacitance value, during this phase, the common-mode voltage at the second or fourth compensation terminal 124 or 125 is:

$$V_{124,125} = \frac{V_{112} + V_{113}}{2}. \quad (1)$$

$V_{112}$ is the voltage at the first buffer input 112 and $V_{113}$ is the voltage at the second buffer input 113.

The compensation charge stored in the first compensation capacitor 120 and the second compensation capacitor 121 is equal to:

$$Q_C = C\frac{V_{112} - V_{113}}{2}. \quad (2)$$

C is the equivalent capacitance value of the first compensation capacitor 120 and the second compensation capacitor 121.

The equivalent capacitance value C may be chosen to be equal to the sum of the first input capacitance value (of the first input capacitor 220) or second input capacitance value (of the second input capacitor 221) and the first shunt capacitance value (of the first shunt capacitor 260) or second shunt capacitance value (of the second shunt capacitor 261) of the sample and hold circuit 402. In this last case $Q_c$ is also equivalent to the input charge leakage lost during one sampling phase. For higher number of clock phases, the input charge leakage increases proportionally to the number of clock phases.

The switch 142 is switched off by the control circuit 152 during the holding phase. Each compensation capacitor 120, 121 injects the compensation charge equivalent to (2) back to the respective sample and hold inputs 202 and 203 and eventually back to the filter shunt capacitor 274, thereby fully compensating for the input charge leakage occurred during the preceding sampling phase.

Figure 5:
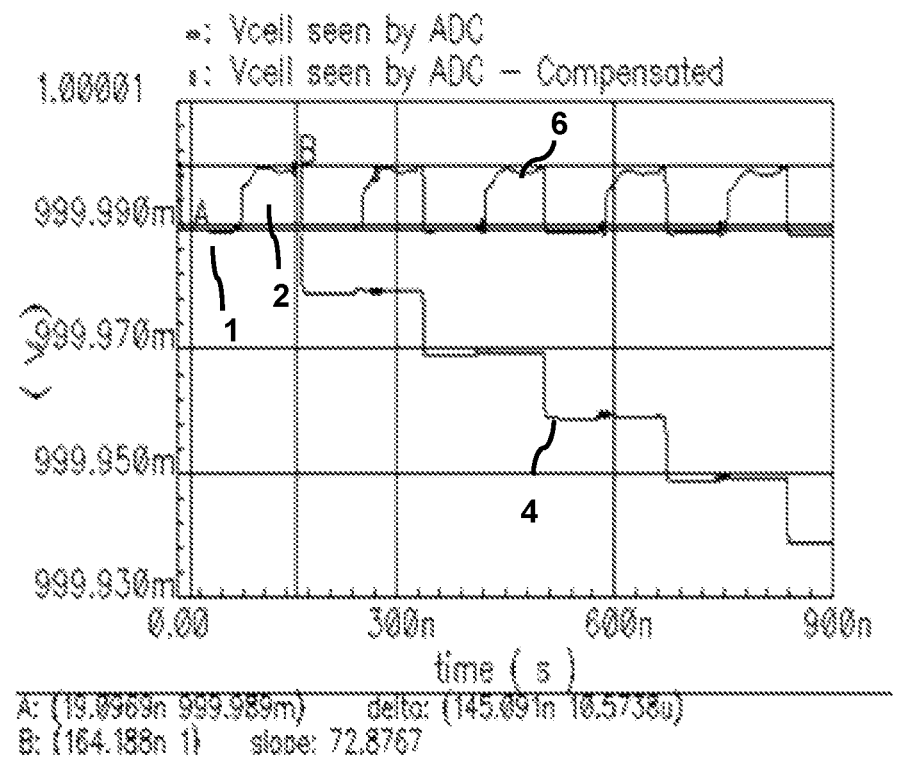
FIG. 5 shows a diagram of a sampled voltage value versus time for the circuit shown in FIGS. 4.

FIG. 5 shows a measured diagram of a sampled voltage 6 value versus time, demonstrating the effect of the input charge leakage compensation on the sampled voltage value.

The diagram of FIG. 5 shows a screenshot of a simulation display while measuring the voltage 6 at the output of the input charge-compensated circuit 500 shown in FIG. 4 with compensation circuits 102 and 103. The measured voltage 6 is compared to a measured voltage 4 of the same circuit but without the compensation circuits 102 and 103. Phase 1 is the sampling phase of the sample and hold circuit 402 and phase 2 is the holding phase of the sample and hold circuit 402. FIG. 5 shows that while the measured voltage 6 remains flat over time with a value of precisely 1 V, the voltage 4 drops over time degrading the accuracy of the sample and hold circuit and of the converter based thereon.

The input charge-compensated circuit 400 or 500 may be used in an analogue to digital converter for converting an analogue input voltage signal into digital output values. The analogue to digital converter can include said input charge-compensated circuit 400 or 500 and processing means configured to receive the sampled analogue input voltage signal from the amplifier output and convert the sampled analogue input voltage signal into corresponding digital output values.

Figure 6:
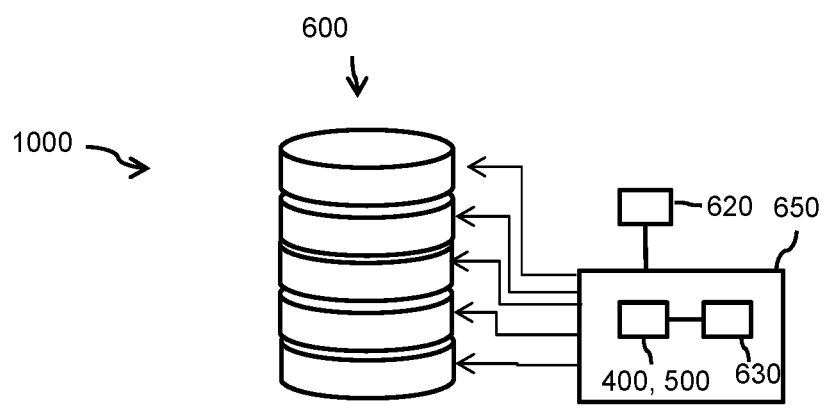
FIG. 6 shows an example of a battery management system.

FIG. 6 shows an example of a battery management system 1000. The battery management system 1000 includes a stack of battery cells 600, for example electrically connected in parallel between each other, a battery controller 650 for monitoring a charge level of the battery cells 600 and a display 620 coupled to the battery controller 650 configured for displaying the measured battery level of the stack of batteries.

The battery controller 650 includes the input charge-compensated circuit 400 or 500 including the corresponding input filter 270 or 271 for measuring battery level of each battery cell and a processor 630 for digitizing the battery level of the battery cells. The battery controller 650 may include an analogue to digital converter making use of the input charge-compensated circuit 400 or 500.

The battery controller 650, or the input charge-compensated circuit 400, 500 may be an integrated circuit device.

The battery management system 1000 may for example be implemented in electric vehicles, electric powertrains or the like, to monitor the battery level of battery cells to allow, for example, to charge them when needed or to be able to control the correct functioning of the battery cells. By using the described compensation circuits 100, 102 or 103 and input charge-compensated circuits 400 or 500, the battery management system 1000 monitors the battery level of each battery with greater accuracy and with lower hardware components count than prior art solutions.

It is to be understood that the architectures depicted herein are merely exemplary, and that in fact many other architectures can be implemented which achieve the same functionality.

For example, in the FIGS. 1, 2 and 4 the control circuit 150, 152 has been shown to be embedded in the compensation circuit 100 or 102. However, the control circuit 150, 152 may be part of the sample and hold circuit 200, 201 or 402 or input charge-compensated circuit 400 or 500. Also, the compensation circuits 100, 102 and 103 have been described with reference to specific examples of sample and hold circuits 200, 201 and 402. However, the compensation circuits 100, 102 and 103 are independent on the topology of the sample and hold circuits 200, 201 and 402 or type of ADC used. The compensation circuits 100, 102 and 103 directly compensate for input charges at the input of the sample and hold circuits 200, 201 and 402.

In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably electrically coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Furthermore, the devices may be physically distributed over a number of apparatuses, while functionally operating as a single device. Also, devices functionally forming separate devices may be integrated in a single physical device. Also, the units and circuits may be suitably combined in one or more semiconductor devices. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A compensation circuit for compensating for an input charge at a first input of a sample and hold circuit, the input charge for charging a first input capacitor of the sample and hold circuit during sampling an analogue input voltage signal, the compensation circuit comprising:
   a first buffer having a first buffer input for electrically coupling to the first input of the sample and hold circuit, and a first buffer output;
   a first compensation capacitor comprising
      a first compensation terminal switchable between the first buffer input and the first buffer output, and
      a second compensation terminal switchable between the first buffer output and a reference terminal; and
   a control circuit configured to
      switch the first compensation terminal to the first buffer output and the second compensation terminal to the reference terminal when the sample and hold circuit is configured for sampling the analogue input voltage signal, for storing a compensation charge into the first compensation capacitor, wherein the compensation charge is substantially equal to the input charge, and
      switch the first compensation terminal to the first buffer input and the second compensation terminal to the first buffer output when the sample and hold circuit is configured for holding the analogue input voltage signal, for discharging the first compensation capacitor of the stored compensation charge into the first input of the sample and hold circuit.

2. A compensation circuit according to claim 1, further comprising:
a first compensation switch arranged for electrically coupling,
when the first compensation switch is switched in a first state, the first compensation terminal to the first buffer output , and
when the first compensation switch is switched in a second state, the first compensation terminal to the first buffer input;
a second compensation switch arranged for electrically coupling,
when the second compensation switch is switched in a third state, the second compensation terminal to the reference terminal, and
when the second compensation switch is switched in a fourth state, the second compensation terminal to the first buffer output, wherein the control circuit is configured:
to control the first compensation switch in the first state and the second compensation switch in the third state, when the sample and hold circuit is configured for sampling the analogue input voltage signal, and
to control the first compensation switch in the second state and the second compensation switch in the fourth state when the sample and hold circuit is configured for holding the analogue input voltage signal.

3. A compensation circuit according to claim 2, wherein the first compensation switch is implemented with a third compensation switch and a fourth compensation switch, configured to, when switched on, electrically couple the first compensation terminal to the first buffer output and the first compensation terminal to the first buffer input, respectively.

4. A compensation circuit according to claim 2, wherein the second compensation switch is implemented with a fifth compensation switch and a sixth compensation switch, configured to, when switched on, electrically couple the second compensation terminal to the reference terminal and the second compensation terminal to the first buffer output, respectively.

5. A compensation circuit according to claim 1, wherein the reference terminal is electrically coupled to the ground.

6. An input charge-compensated circuit comprising:
a sample and hold circuit for sampling and holding an analogue input voltage signal, the sample and hold circuit comprising
an amplifier having a first amplifier input, a second amplifier input and an amplifier output,
a first input capacitor having a first input capacitor terminal and a second input capacitor terminal electrically connected to the first amplifier input,
a first feedback capacitor for capacitively coupling the first amplifier input to the amplifier output,
a first sample and hold switch configured to electrically couple,
when the first sample and hold switch is switched in a fifth state, the first input of the sample and hold circuit to the first input capacitor terminal, and
when the first sample and hold switch is switched in a sixth state, the first input capacitor terminal to the second amplifier input; and
a compensation circuit for compensating for an input charge at the first input of the sample and hold circuit, the compensation circuit comprising
a first buffer having a first buffer input for electrically coupling to the first input of the sample and hold circuit, and a first buffer output,
a first compensation capacitor comprising
a first compensation terminal switchable between the first buffer input and the first buffer output, and
a second compensation terminal switchable between the first buffer output and a reference terminal; and
a control circuit configured to
switch the first sample and hold circuit switch in the fifth state for sampling the analogue input voltage signal, and switch the first compensation terminal to the first buffer output and the second compensation terminal to the reference terminal, for storing a first compensation charge into the first compensation capacitor, wherein the first compensation charge is substantially equal to the input charge, and
switch the first sample and hold circuit switch in the sixth state for holding the analogue input voltage signal, and switch the first compensation terminal to the first buffer input and the second compensation terminal to the first buffer output, for discharging the first compensation capacitance of the stored compensation charge into the first input of the sample and hold circuit.

7. The input charge-compensated circuit according to claim 6, wherein the second amplifier input is electrically coupled to a reference potential.

8. The input charge-compensated circuit according to claim 6, wherein the first input of the sample and hold circuit is configured to couple to an input filter for filtering a source voltage signal of frequency components above a predetermined frequency, wherein the input filter is arranged in series with a voltage source for supplying the source voltage signal, and the filtered source voltage signal is the analogue input voltage signal.

9. The input charge-compensated circuit according to claim 6, wherein the first compensation capacitor has a first compensation capacitance value and the first input capacitor has a first input capacitance value substantially equivalent to the first compensation capacitance value.

10. The input charge-compensated circuit according to claim 9, the compensation circuit further comprising:
a first compensation switch configured to electrically couple,
when the first compensation switch is switched in a first state, the first compensation terminal to the first buffer output, and
when the first switch is switched in a second state, the first compensation terminal to the first buffer input;
a second compensation switch configured to electrically couple,
when the second compensation switch is switched in a third state, the second compensation terminal to the first reference terminal, and
when the second compensation switch is switched in a fourth state, the second compensation terminal to the first buffer output, wherein the control circuit is configured to
control the first compensation switch in the first state and the second compensation switch in the third state, when the first sample and hold circuit switch is switched in the fifth state, and control the first compensation switch in the second state and the second compensation switch in the fourth state, when the first sample and hold circuit switch is switched in the sixth state.

11. The input charge-compensated circuit of claim 10, wherein the sample and hold circuit comprises:
a second sample and hold circuit switch, arranged in parallel to the first feedback capacitor, and configured to electrically connect, when switched on, the first amplifier input to the amplifier output; wherein
the control circuit is configured to switch on the second sample and hold circuit switch to reset the first feedback capacitor while sampling the analogue input voltage signal and to switch off the second sample and hold circuit switch while holding the analogue input voltage signal.

12. The input charge-compensated circuit according to claim 6, comprising:
a first shunt capacitor comprising a first shunt terminal electrically coupled to the first input capacitor terminal and a second shunt terminal electrically coupled to the reference potential.

13. The input charge-compensated circuit according to claim 12, wherein the first shunt capacitor has a first shunt capacitance value, the first input capacitor has a first input capacitance value and the first compensation capacitor has a first compensation capacitance value substantially equivalent to the sum of the first shunt capacitance value and the first input capacitance value.

14. A compensation circuit according to claim 1, wherein the compensation circuit is a differential compensation circuit configured to compensate differential input charge at a differential input of a differential sample and hold circuit for sampling and holding a differential analogue input voltage signal, the compensation circuit further comprising:
a second buffer having a second buffer input for electrically coupling to a second input of the sample and hold circuit and a second buffer output;
a second compensation capacitor comprising
a third compensation terminal switchable between the second buffer input and the second buffer output, and
a fourth compensation terminal for coupling to the first reference terminal and switchable to the second buffer output; and
a control circuit configured:
to switch the third compensation terminal and the fourth compensation terminal in synchronicity with the first compensation terminal and the second compensation terminal, respectively.

15. A compensation circuit according to claim 2, further comprising:
a sixth switch arranged in series with the second buffer and configured to electrically couple,
when the sixth switch is in a fifth state, the second buffer output to the third compensation terminal, and
when the sixth switch is switched in a sixth state, the third compensation terminal to the second buffer input;
a seventh switch arranged to electrically couple, when switched on, the second buffer output to the fourth compensation terminal;
wherein the control circuit is configured to switch the sixth switch and the seventh switch in synchronicity with the first compensation switch and the second compensation switch, respectively.

16. An input-charge compensated circuit according to claim 6, wherein the sample and hold circuit is a differential sample and hold circuit configured to sample and hold a differential analogue differential input voltage signal, wherein the input-charge compensated circuit comprises:
a further compensation circuit configured to compensate for a further input charge at the second input of the sample and hold circuit, the further compensation circuit comprising:
a second buffer having a second buffer input configured to electrically couple to the second input of the sample and hold circuit and a second buffer output,
a second compensation capacitor comprising
a third compensation terminal switchable between the second buffer input and the second buffer output, and
a fourth compensation terminal for electrically coupling to the reference terminal and switchable to the second buffer output; and
wherein the control circuit is configured to
to switch the third compensation terminal and the fourth compensation terminal in synchronicity with the first compensation terminal and second compensation terminal.

17. An input-charge compensated circuit according to claim 16, the further compensation circuit further comprising:
a sixth switch, arranged in series with the second buffer, and configured to electrically couple,
when the sixth switch is in a fifth state, the second buffer output to the third compensation terminal, and
when the first switch is switched in a sixth state, the third compensation terminal to the second buffer input;
a seventh switch configured to electrically couple, when switched on, the second buffer output to the fourth compensation terminal; wherein
the control circuit is configured to
switch the sixth switch in the fifth state and switch off the seventh switch when the sample and hold circuit is configured for sampling the differential analogue input voltage signal, and
switch the sixth switch in the sixth state and switch on the seventh switch when the sample and hold circuit is configured for holding the differential analogue input voltage signal.

18. A converter circuit for converting an analogue input voltage signal into digital output values, comprising the input charge-compensated circuit as claimed in claim 6 and processing means configured to receive the sampled analogue input voltage signal from the amplifier output and convert the sampled analogue input voltage signal into corresponding digital output values.

19. A battery controller for monitoring a level of a battery, comprising the input charge compensated circuit as claimed in claim 6 for measuring the battery level, and a processor configured for digitizing the measured battery level.

20. A battery management system comprising the battery controller as claimed in claim 19, one or more batteries electrically coupled in parallel, and a display for displaying the battery level of the one or more batteries, wherein the battery controller is configured for monitoring the one or more batteries.

* * * * *